United States Patent
Chao et al.

(10) Patent No.: US 10,489,242 B1
(45) Date of Patent: Nov. 26, 2019

(54) MEMORY SCRUB SYSTEM

(71) Applicant: Dell Products L.P., Round Rock, TX (US)

(72) Inventors: Ching-Lung Chao, Austin, TX (US); Shih-Hao Wang, New Taipei (TW); Zhengyu Yang, Fremont, CA (US)

(73) Assignee: Dell Products L.P., Round Rock, TX (US)

( * ) Notice: Subject to any disclaimer, the term of this patent is extended or adjusted under 35 U.S.C. 154(b) by 30 days.

(21) Appl. No.: 15/970,454

(22) Filed: May 3, 2018

(51) Int. Cl.
| | | |
|---|---|---|
| *G11C 29/00* | (2006.01) | |
| *G06F 11/10* | (2006.01) | |
| *G06F 11/07* | (2006.01) | |
| *G11C 29/52* | (2006.01) | |
| *G06F 9/4401* | (2018.01) | |
| *G06F 13/24* | (2006.01) | |

(52) U.S. Cl.
CPC .......... *G06F 11/106* (2013.01); *G06F 9/4401* (2013.01); *G06F 11/0772* (2013.01); *G06F 13/24* (2013.01); *G11C 29/52* (2013.01)

(58) Field of Classification Search
CPC .. G06F 11/106; G06F 9/4401; G06F 11/0772; G06F 13/24; G06F 9/44557; G06F 3/061; G06F 3/0679; G06F 3/0661; G06F 13/4234; G06F 3/0613; G06F 3/0689; G06F 3/0688; G06F 3/0659; G06F 13/4059; G06F 12/0246; G06F 13/1657; G06F 17/505; G06F 17/5072; G06F 12/0811; G06F 12/0824; G11C 29/52; G11C 7/1072

See application file for complete search history.

(56) References Cited

U.S. PATENT DOCUMENTS 4,964,129 A 10/1990 Bowden, III et al.
7,496,823 B2 2/2009 Wheeler et al.

*Primary Examiner* — Guerrier Merant
(74) *Attorney, Agent, or Firm* — Haynes and Boone, LLP

(57) ABSTRACT

A memory scrubbing system includes a persistent memory device coupled to an operating system (OS) and a Basic Input/Output System (BIOS). During a boot process and prior to loading the OS, the BIOS retrieves a known memory location list that identifies known memory locations of uncorrectable errors in the persistent memory device and performs a partial memory scrubbing operation on the known memory locations. The BIOS adds any known memory locations that maintain an uncorrectable error to a memory scrub error list. The BIOS then initiates a full memory scrubbing operation on the persistent memory device, cause the OS to load and enter a runtime environment while the full memory scrubbing operation is being performed, and provides the memory scrub error list to the OS.

20 Claims, 4 Drawing Sheets

MEMORY SCRUB SYSTEM

BACKGROUND

The present disclosure relates generally to information handling systems, and more particularly to scrubbing memory used in information handling systems.

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Information handling systems such as, for example, server devices, desktop computing devices, laptop computing devices, and/or other computing devices known in the art, typically include a Basic Input/Output System (BIOS) that is provided by non-volatile firmware that is configured to perform hardware initialization during a booting process for the computing device, as well as provide runtime services for an operating system and applications executed by the computing device. Conventionally, during the booting process, the BIOS may perform memory scrubbing operations (e.g., Address Range Scrub (ARS) according to the Advanced Configuration and Power Interface (ACPI) specification) on persistent memory such as, for example, non-volatile dual in-line memory modules (NVDIMMs) included in the computing device. The memory scrubbing operation provides for the checking of memory locations in the persistent memory that are experiencing errors, and attempts to correct those errors. Upon completion of the memory scrubbing operations, the BIOS reports memory locations that are uncorrectable using the memory scrubbing operations to the operating system of the computing device, and the operating system and software applications in the computing device will then not use those memory locations while the computing device is in a runtime environment. For example, a BIOS configured according to the ACPI specification may provide a memory root device notification to the operating system, which causes the operating system to call a Device Specific Method (DSM) to query for a memory scrub error record. If the memory scrub error record includes any memory locations that are experiencing an uncorrectable error, the operating system will exclude the memory locations from use.

Many operating system boot loaders wait until the memory scrubbing operations complete before the operating system boot loader loads the operating system, which ensures that the operating system and the software applications will not use the memory locations that are experiencing uncorrectable errors. However, the memory scrubbing operations may take a relatively long time to complete. For example, performing the memory scrubbing operations on one 16 GB NVDIMM-N may take up to 5 minutes to complete. Thus, a computing device that has 12 16 GB NVDIMM-Ns may require an hour to complete the memory scrubbing operations before the computing device enters the runtime environment. In order decrease the time required for the computing device to enter the runtime environment, some operating systems do not wait for the memory scrubbing operations to complete, and instead enter the runtime environment before the memory scrubbing operations have completed. However, while those memory scrubbing operations are being completed, the operating systems then run the risk of using memory locations in the persistent memory that have correctable errors and/or uncorrectable errors, which may result in lost data or reduced system performance.

Accordingly, it would be desirable to provide an improved memory scrub system.

SUMMARY

According to one embodiment, an Information Handling System (IHS), includes: a persistent memory device; a processing subsystem coupled to the persistent memory device; and a memory subsystem that is coupled to the processing subsystem and that includes instructions that, when executed by the processing subsystem, causes the processing subsystem to provide a Basic Input/Output System (BIOS) that is configured to: retrieve, during a boot process and prior to loading an operating system (OS), a known memory location list that identifies known memory locations of uncorrectable errors in the persistent memory device; determine, during the boot process and while performing a partial memory scrubbing operation on the known memory locations in the persistent memory device that are identified in the known memory location list, whether any of the known memory locations maintain an uncorrectable error; add the known memory locations that maintain an uncorrectable error to a memory scrub error list; initiate a full memory scrubbing operation on the persistent memory device; cause the OS to load and enter a runtime environment while the full memory scrubbing operation is being performed; and provide the memory scrub error list to the OS.

DETAILED DESCRIPTION

For purposes of this disclosure, an information handling system may include any instrumentality or aggregate of instrumentalities operable to compute, calculate, determine, classify, process, transmit, receive, retrieve, originate, switch, store, display, communicate, manifest, detect, record, reproduce, handle, or utilize any form of information, intelligence, or data for business, scientific, control, or other purposes. For example, an information handling system may be a personal computer (e.g., desktop or laptop), tablet computer, mobile device (e.g., personal digital assistant (PDA) or smart phone), server (e.g., blade server or rack server), a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, touchscreen and/or a video display. The information handling system may also include one or more buses operable to transmit communications between the various hardware components.

Figure 1:
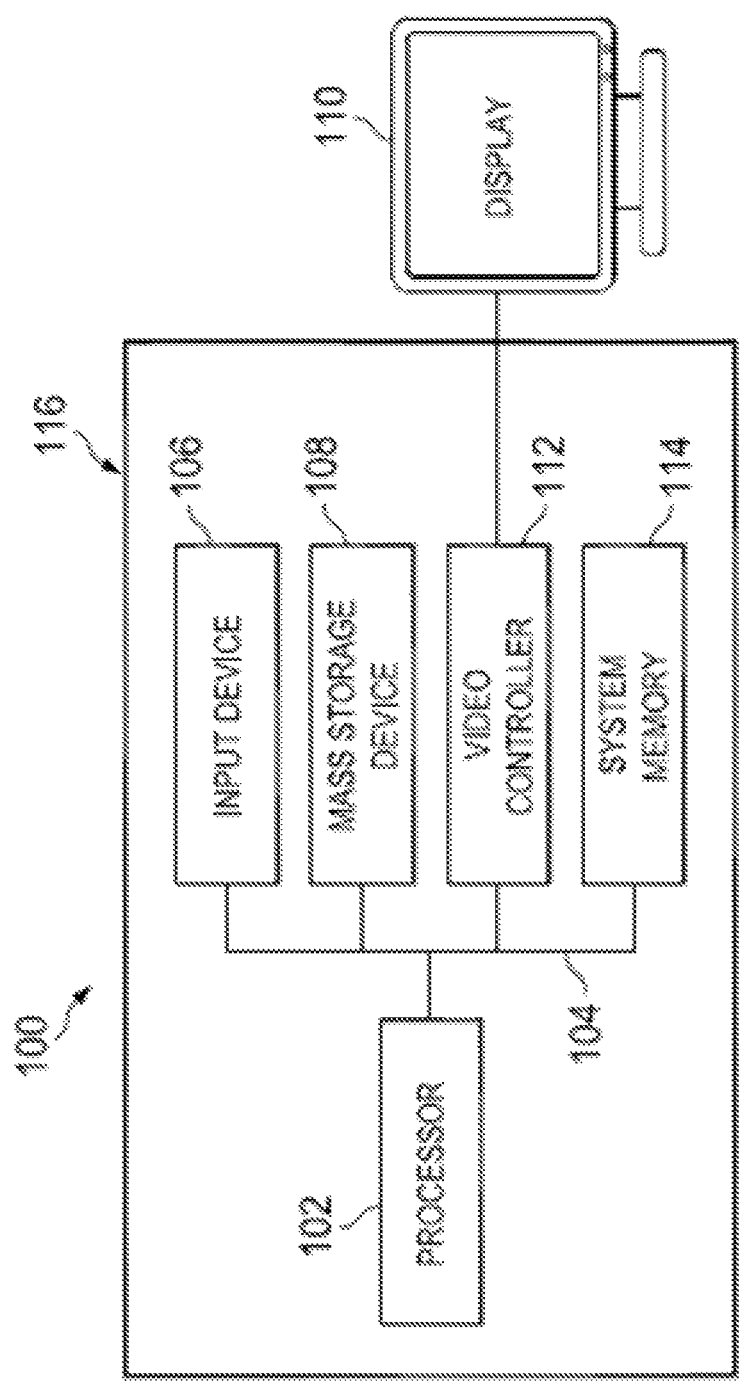
FIG. 1 is a schematic view illustrating an embodiment of an information handling system.

In one embodiment, IHS 100, FIG. 1, includes a processor 102, which is connected to a bus 104. Bus 104 serves as a connection between processor 102 and other components of IHS 100. An input device 106 is coupled to processor 102 to provide input to processor 102. Examples of input devices may include keyboards, touchscreens, pointing devices such as mouses, trackballs, and trackpads, and/or a variety of other input devices known in the art. Programs and data are stored on a mass storage device 108, which is coupled to processor 102. Examples of mass storage devices may include hard discs, optical disks, magneto-optical discs, solid-state storage devices, and/or a variety other mass storage devices known in the art. IHS 100 further includes a display 110, which is coupled to processor 102 by a video controller 112. A system memory 114 is coupled to processor 102 to provide the processor with fast storage to facilitate execution of computer programs by processor 102. Examples of system memory may include random access memory (RAM) devices such as dynamic RAM (DRAM), synchronous DRAM (SDRAM), solid state memory devices, and/or a variety of other memory devices known in the art. In an embodiment, a chassis 116 houses some or all of the components of IHS 100. It should be understood that other buses and intermediate circuits can be deployed between the components described above and processor 102 to facilitate interconnection between the components and the processor 102.

Figure 2:
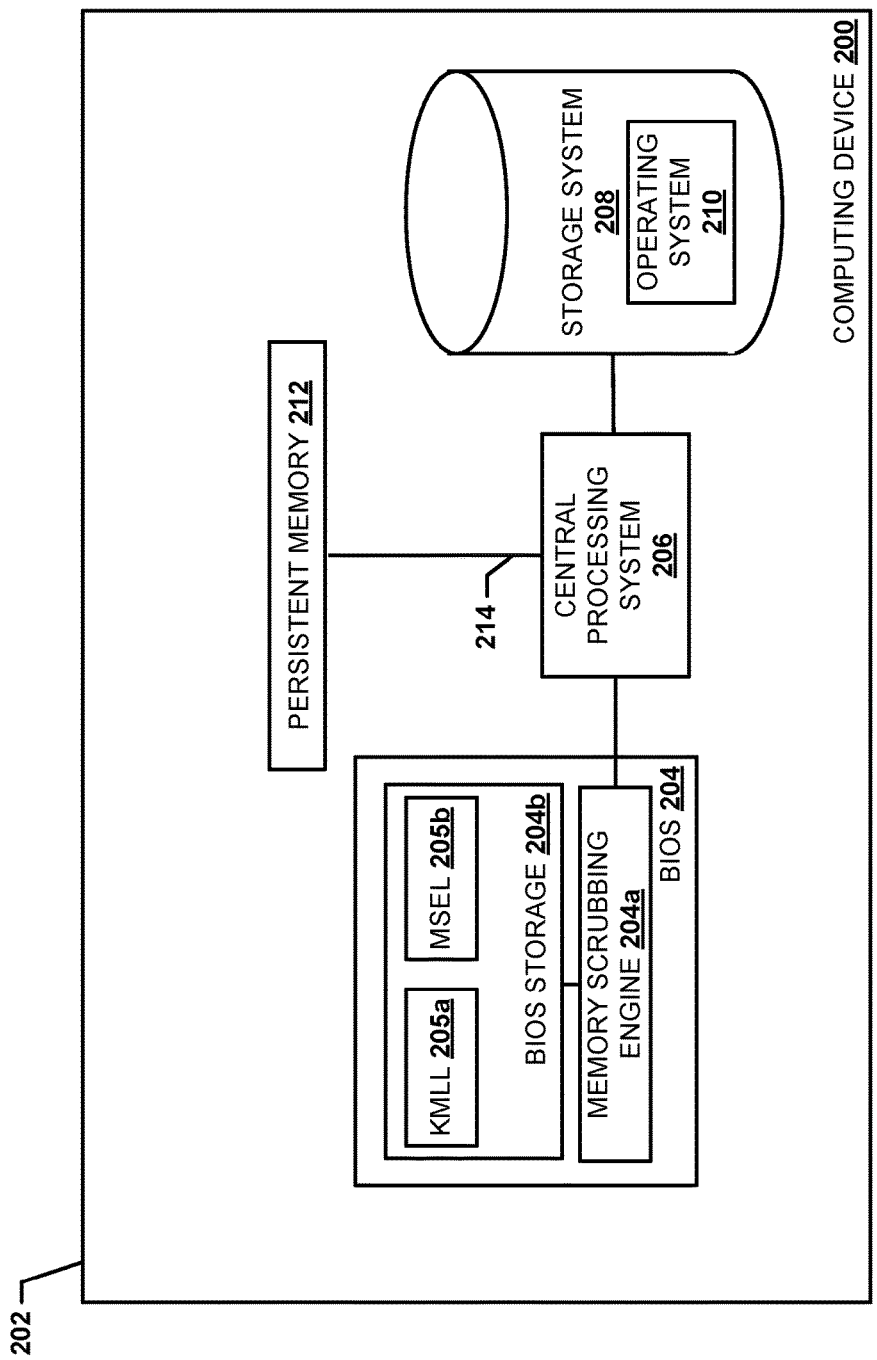
FIG. 2 is a schematic view illustrating an embodiment of a computing device that includes a memory scrub system.

Referring now to FIG. 2, an embodiment of a computing device 200 is illustrated that may be provided by the IHS 100 discussed above with reference to FIG. 1, and/or may include some or all of the components of the IHS 100. In specific embodiments, the computing device 200 may be a server device, a desktop computing device, a laptop/notebook computing device, a tablet computing device, a mobile phone, and/or a variety of other computing devices that would be apparent to one of skill in the art in possession of the present disclosure. In the illustrated embodiment, the computing device 200 includes a chassis 202 that houses the components of the computing device 200, only some of which are illustrated in FIG. 2. For example, the chassis 202 may house a Basic Input/Output System (BIOS) processing subsystem (not illustrated, but which may include the processor 102 discussed above with reference to FIG. 1) and a BIOS memory subsystem (not illustrated, but which may include the memory 114 discussed above with reference to FIG. 1) that includes instructions that, when executed by the BIOS processing subsystem, cause the BIOS processing subsystem to provide a BIOS 204 that is configured to perform the functions of the BIOS and/or computing devices discussed below.

As would be appreciated by one of skill in the art in possession of the present disclosure, the BIOS 204 may be provided by non-volatile firmware (e.g., provided by the combination of the BIOS processing subsystem and BIOS memory subsystem discussed above) that is configured to perform hardware initialization during a booting process of the computing device 200, as well as provide runtime services for operating systems and/or other programs/applications executed on the computing device 200. While referred to as a "BIOS", one of skill in the art in possession of the present disclosure will recognize that the BIOS 204 may be provided according to the Unified Extensible Firmware Interface (UEFI) specification and, as such, may include or be coupled to a software interface between an operating system provided by the computing device 200 and platform firmware included in the computing device 200. Thus, the BIOS 204 may be provided by UEFI firmware that may also provide UEFI functionality, legacy support for BIOS services, and/or other functionality while remaining within the scope of the present disclosure as well.

In the illustrated embodiment, the BIOS 204 includes a memory scrubbing engine 204a that may be provided, for example, by the BIOS processing subsystem discussed above via the execution of instructions included on the BIOS memory subsystem discussed above. One of skill in the art in possession of the present disclosure will recognize that the memory scrubbing engine 204a is illustrated and described herein as providing memory scrub functionality of the present disclosure, and that the BIOS 204 may perform a variety of other BIOS functionality while remaining within the scope of the present disclosure as well. The BIOS 204 also includes a BIOS storage 204b that is coupled to the memory scrubbing engine 204a (e.g., via a coupling between the BIOS storage 204b and the BIOS processing subsystem), and that may store any of the information utilized as discussed below (e.g., memory scrub rules, a known memory location list (KMLL) 205a, a memory scrub error list (MSEL) 205b, and/or any other BIOS information that would be apparent to one of skill in the art in possession of the present disclosure.) For example, the BIOS storage 204b may be provided by a BIOS Serial Peripheral Interface (SPI) flash storage device, although other storage subsystems will fall within the scope of the present disclosure as well. While the known memory location list 205a and the memory scrub error list 205b are illustrated as being location in the BIOS storage 204b, one of skill in the art in possession of the present disclosure would recognize that the known memory location list 205a and the memory scrub error list 205b may be located in any memory system accessible by the BIOS 204.

The chassis 202 may also house a central processing system 206 (e.g., a Central Processing Unit (CPU)) that is coupled to the memory scrubbing engine 204a in the BIOS 204 (e.g., via a coupling between the BIOS processing subsystem and the central processing system 206.) In various embodiments, the central processing system 206 may load BIOS instructions that provide the BIOS 204, execute the BIOS instructions to provide the BIOS 204 on one or more of cores of the central processing system 206, and/or perform other central processing system functionality that would be apparent to one of skill in the art in possession of the present disclosure. The chassis 202 may also house a storage system 208 that is coupled to the central processing system 206 and/or the BIOS 204. The storage system 208 may include any of a variety of storage devices and/or other components that allow for the storage of an operating system (OS) 210 that may be loaded during the booting process by the BIOS 204 and the central processing system 206 and executed while the computing device 200 is in a runtime environment, as well as the other data discussed below.

The chassis 202 may also house one or more persistent memory devices such as a persistent memory device 212. The persistent memory device 212 may be coupled to the BIOS 204 and/or the central processing system 206 by one or more communication buses such as, for example, a communication bus 214. In an embodiment, the persistent memory device 212 may include a non-volatile dual in-line memory module (NVDIMM) (e.g., NVDIMM-F, NVDIMM-N, NVDIMM-P, NVDIMM-X), and/or any other persistent memory device that includes byte-addressable memory that retains its contents after power loss, as would be apparent to one of skill in the art in possession of the present disclosure. While one persistent memory device 212 is illustrated in the chassis 202, one of skill in the art in possession of the present disclosure will recognize that any number of persistent memory devices may be provided in the computing device 200 while remaining within the scope of the present disclosure.

Figure 3A:
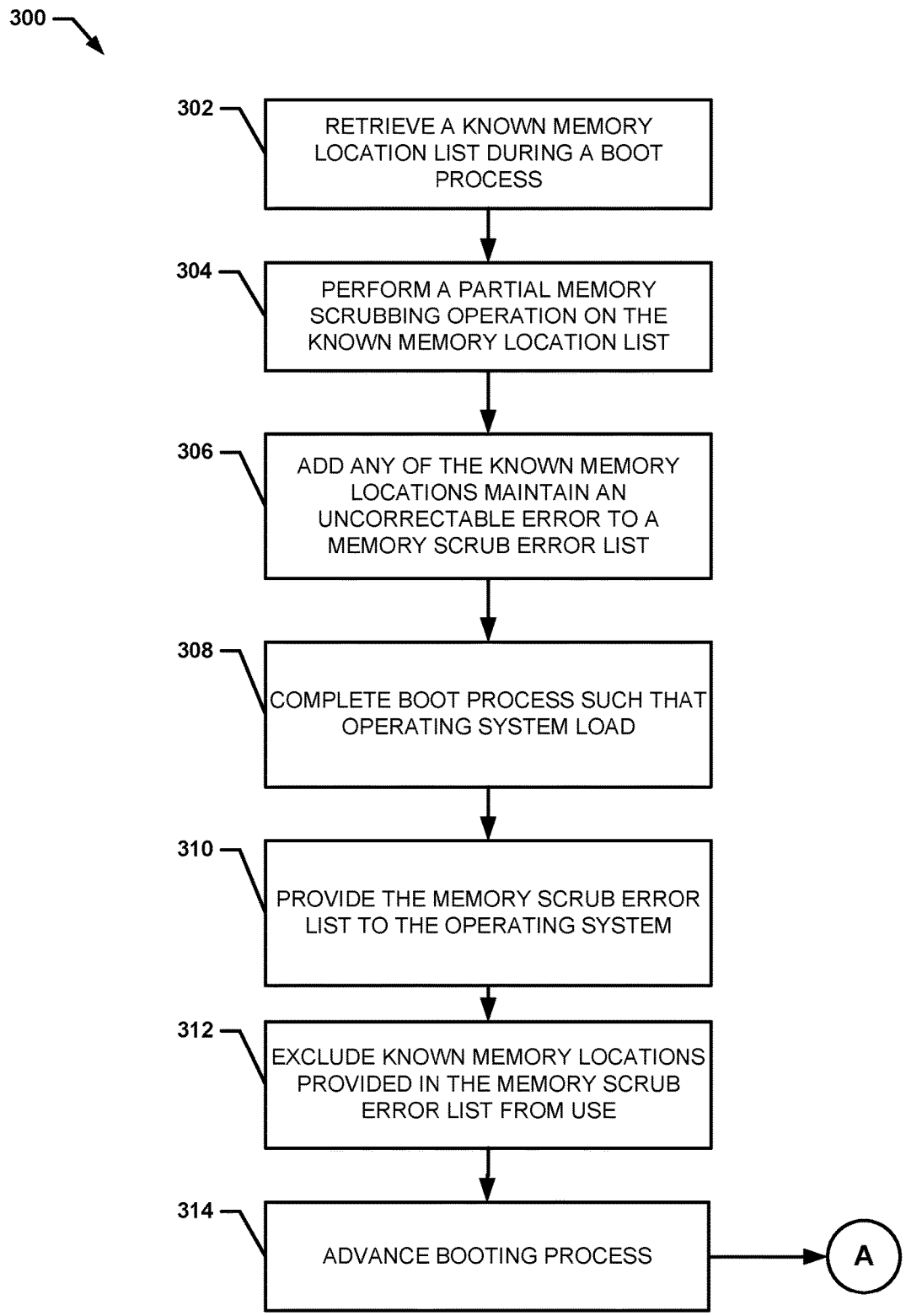
FIG. 3A is a flow chart illustrating an embodiment of a method for scrubbing memory.
Figure 3B:
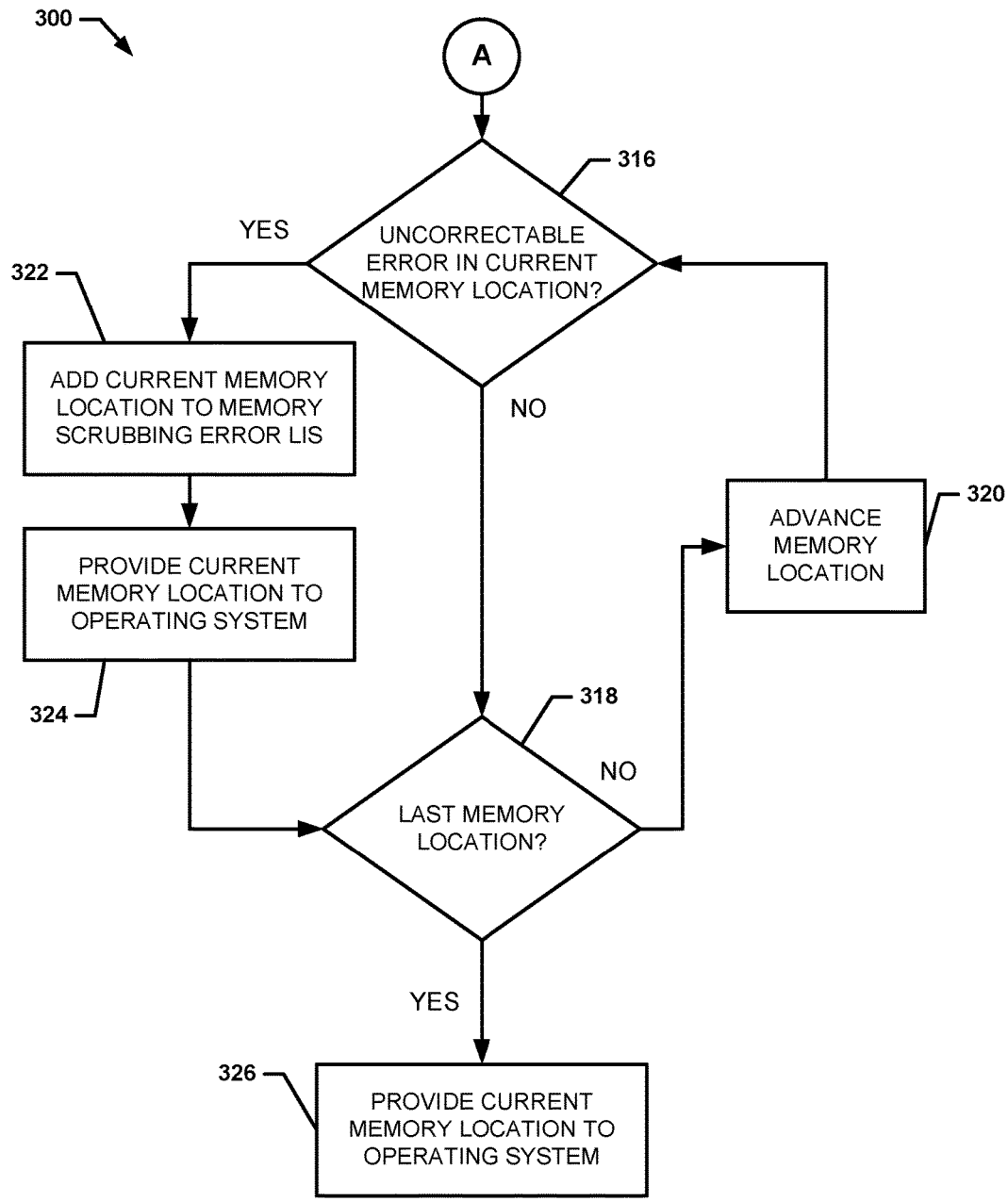
FIG. 3B a flow chart illustrating a continuation of the embodiment of the method for scrubbing memory of FIG. 3A.

Referring now to FIG. 3A and FIG. 3B, an embodiment of a method 300 for scrubbing memory is illustrated. As discussed above, in conventional memory scrubbing systems the loading of an operating system during a boot process such that it may enter a runtime environment may be delayed until a BIOS completes memory scrubbing operations. In such systems, the BIOS may require up to an hour or more to complete the memory scrubbing operations depending on the amount of persistent memory the BIOS is scrubbing. In other conventional memory scrubbing systems, the time for the boot process may be reduced by loading the operating system such that it may enter the runtime environment before the BIOS completes the memory scrubbing operation. However, in such systems, the operating system has no knowledge of the memory locations experiencing errors, and thus runs the risk of using those memory locations while the memory scrubbing operations are being completed, which may result in loss of data and/or system errors. The systems and methods of the present disclosure address these issues by providing a BIOS that, during the booting process, performs partial memory scrubbing operations on known memory locations that are experiencing errors in a persistent memory device. After the partial memory scrubbing operation is performed on the known memory locations by the BIOS, the BIOS causes the operating system to load, provides any known memory locations that maintain an uncorrectable error to the operating system so that the operating system is aware (and does not utilized) those known memory locations, and then performs a full memory scrubbing operation on the persistent memory device while the operating system is in the runtime environment.

The method 300 begins at block 302 where, during a boot process and prior to loading an operating system, a known memory location list is retrieved that identifies known memory locations experiencing errors in a persistent memory device. In an embodiment of block 302, the BIOS 204 may initialize and retrieve the known memory location list 205a from the BIOS storage 204b. While the known memory location list 205 is illustrated as being stored on the BIOS storage 204b, one of skill in the art in possession of the present disclosure would recognize that the known memory location list 205 may be stored on any other non-volatile storage device that is coupled to the BIOS 204 and that is accessible to the BIOS 204 during a booting process. The known memory location list 205a may include any known memory locations that are experiencing errors (e.g., a correctable error that may be corrected using an error correction code provided by a memory scrubbing operation, and/or an uncorrectable error that may not be correctable by a memory scrubbing operation). The known memory location list 205a may have been compiled while the computing device 200 was operating in a previous runtime environment (e.g., by the BIOS 204 and/or operating system 210.) For example, the known memory location list 205a may include memory locations experiencing uncorrectable errors detected during a prior memory scrubbing operation, and/or any memory locations that were detected as experiencing errors by the operating system 210 in the previous runtime environment. For example, if any error is reported during the previous runtime environment, a system management interrupt (SMI) may have been generated to allow the BIOS 204 to process the error. In addition to logging the error to a system event log (SEL) that may be provided by a memory associated with a Baseboard Management Controller (BMC), the BIOS 204 may log the memory location in the known memory location list 205a.

The method 300 then proceeds to block 304 where a partial memory scrubbing operation is performed on the known memory locations in the persistent memory device that are identified in the known memory location list. In an embodiment of block 304, after retrieval of the known memory location list 205a, the memory scrubbing engine 204a of the BIOS 204 may initiate a partial memory scrubbing operation on the persistent memory device 212 during the boot process and prior to the loading of the operating system 210 such that the computing device 200 may enter the runtime environment. The partial memory scrubbing operation may be provided by an Address Range Scrub (ARS) performed according to the Advanced Configuration and Power Interface (ACPI) specification and/or any other memory scrubbing operation that would be apparent to one of skill in the art in possession of the present disclosure. The partial memory scrubbing operation may be performed on the known memory locations of the persistent memory device 212 that are identified by the known memory location list 205a. As would be appreciated by one of skill in the art in possession of the present disclosure, performing the partial memory scrubbing operation to the known memory locations in the persistent memory device 212 is relatively faster than performing a full memory scrubbing operation to all of the memory locations of the persistent memory device 212. For example, the partial memory scrubbing operation may take several seconds, rather than the minutes or hours required for the full memory scrubbing operation, due to the reduced number of memory locations of the persistent memory device 212 that the memory scrubbing engine 204a is required to scrub.

The method 300 then proceeds to block 306 where it is determined, based on the partial memory scrubbing operation, whether any of the known memory locations maintain an uncorrectable error. In an embodiment of block 306 and during the partial scrubbing operation initiated in block 304, the memory scrubbing engine 204a of the BIOS 204 may scrub each known memory location in the persistent memory device 212 that are identified by the known memory location list 205a. The memory scrubbing engine 204a may attempt to use an error correction code (ECC) to correct any recoverable errors in the known memory locations of the persistent memory device 212. If the error for a known memory location is uncorrectable by the memory scrubbing engine 204a, the memory scrubbing engine 204a adds the address of that known memory location that is experiencing the uncorrectable error to the memory scrub error list 205b (e.g., which may be provided by a query ARS status output buffer according to the ACPI specification). If the error associated with a known memory location is correctable by the memory scrubbing engine 204a, or there is no error associated with the known memory location, then the memory scrubbing engine 204a does not add the address for that known memory location to the memory scrub error list 205b. The memory scrubbing engine 204a performs the memory scrubbing operation on each of the known memory locations in the persistent memory device 212 that are identified by the known memory location list 205a. In an example, upon completing the partial scrubbing operations on known memory locations in the persistent memory device 212, the memory scrubbing engine 204a may set a byte of a status field in the memory scrub error list 205b from a value that indicates that the partial memory scrubbing operation is "in progress", to a value that indicates that a memory scrubbing operation has been completed by the memory scrubbing engine 204a.

When the memory scrubbing operation has been completed for all known memory locations that are identified by the known memory location list 205a, the method 300 may proceed to block 308 where the booting process may proceed by performing any remaining boot operations, which results in the loading of the operating system. In an embodiment of block 308, the BIOS 204 may continue with any remaining boot operations to complete the booting process, and may initiate an operating system boot loader to load the operating system 210. The BIOS 204 may then provide that operating system boot loader a notification that the memory scrubbing operation has been completed. In an example where the system operates in a conventional manner by requiring memory scrubbing operations to complete before the operating system 210 is loaded such that the computing device 200 may enter the runtime environment, the operating system boot loader for that operating system 210 may issue a query status command to retrieve the value of the status field provided in the memory scrub error list 205b in order to allow for the determination of whether the memory scrubbing operation is complete. In the system of the present disclosure, when the memory scrubbing engine 204a has completed the partial memory scrubbing operation and the status field of the memory scrub error list 205b is set to the value that indicates that the memory scrubbing operation has completed, the operating system boot loader may retrieve this value, determine that memory scrubbing operations are completed, and proceed to load the operating system 210 such that the computing device 200 enters a runtime environment. While a specific example of the BIOS 204 indicating to the operating system 210 that the partial memory scrubbing operations have been completed has been discussed above, one of skill in the art in possession of the present disclosure would recognize that the BIOS 204 may communicate the completion of the partial memory scrubbing operation to the operating system 210 in a variety of different manners without departing from the scope of the present disclosure.

The method 300 then proceeds to block 310 where the memory scrub error list is provided to the operating system. In an embodiment, at block 310, the BIOS 204 may provide the memory scrub error list 205b to the operating system 210. In various examples, the BIOS 204 may provide the memory scrub error list 205b to the operating system 210 when the BIOS 204 provides the status of the of the memory scrubbing operation to the operating system 210 (i.e., when the memory scrub error list 205b includes the status field indicating the status of the memory scrubbing operation.) For example, when the operating system boot loader queries the status of the memory scrubbing operation and the memory scrubbing operation has not completed, the BIOS 204 may provide the memory scrub error list 205b having a value in the status field that indicates that the memory scrubbing operation has not completed or is in progress, which may not provide any of the memory locations having uncorrectable errors. However, if the operating system boot loader queries the status of the memory scrubbing operation and the memory scrubbing operation has completed, the BIOS 204 may provide the memory scrub error list 205b having a value in the status field that indicates that the memory scrubbing operation has completed, which may identify any of the known memory locations in the known memory location list 205a having uncorrectable errors.

The method 300 then proceeds to block 312 where the operating system excludes known memory locations provided in the memory scrub error list from use. In an embodiment of block 312, the operating system 210 may prevent system software running on the computing device 200 while in a runtime environment from accessing the known memory locations having uncorrectable errors that are identified by the memory scrub error list 205b. The method 300 then proceeds to block 314 where a full memory scrubbing operation is initiated for the persistent memory device 212. In an embodiment of block 314, the BIOS 204 may initiate the memory scrubbing engine 204a to perform full memory scrubbing operations on all of the memory locations of the persistent memory device 212. In various embodiments, the full memory scrubbing operations may be performed only on the memory locations of the persistent memory device 212 that were not scrubbed during the partial memory scrubbing operations at block 304. However, in other embodiments, the full memory scrubbing operations may be performed on those memory location(s) of the persistent memory device 212 that were scrubbed during the partial memory scrubbing operations, as well as performed on the memory location(s) of the persistent memory device 212 that were not scrubbed during the partial memory scrubbing operations. While the method 300 illustrates that the full memory scrubbing operations are initiated after the operating system 210 has loaded and the computing device 200 is in the runtime environment, the full memory scrubbing operations may be initiated and performed by the BIOS 204 at any time after the partial memory scrubbing operations have been completed. For example, the full memory scrubbing operations may begin immediately after the memory scrubbing engine 204a finishes the partial memory scrubbing operations, any time during the booting process, or any time after the booting process has completed such that the operating system 210 has loaded and the computing device 200 is in the runtime environment.

The method 300 then proceeds to decision block 316 where it is determined whether an uncorrectable error exists in a current memory location of the persistent memory device during the full memory scrubbing operation that is being performed while the operating system is in the runtime environment. In an embodiment of decision block 316, the memory scrubbing engine 204a will detect whether a current memory location of the persistent memory device 212 being scrubbed using the full memory scrubbing operations includes an uncorrectable error. If the current memory location is not experiencing an uncorrectable error, then the method 300 proceeds to decision block 318 where it is determined whether the current memory location is the last memory location of the persistent memory device for the full memory scrubbing operations. In an embodiment of decision block 318, the memory scrubbing engine 204a may determine whether the address ranges of the persistent memory device 212 given for the full memory scrubbing operation has been completed. If not, the method 300 may proceed to block 320 where the memory scrubbing operation is advanced to the next memory location of the persistent memory device 212 and the method 300 returns to decision block 316.

Referring back to decision block 316, if at decision block 316 a determination is made that the current memory location is experiencing an uncorrectable error, then the method 300 proceeds to block 322 where the current memory location is added to the memory scrub error list. In an embodiment of block 322, the memory scrubbing engine 204a may add the current memory location of the persistent memory device 212 to the memory scrub error list 205b when the full memory scrubbing operation detects an uncorrectable error on the current memory location.

The method 300 then proceeds to block 324 where the current memory location is provided to the operating system. In an embodiment, at block 324, the BIOS 204 may provide the current memory location, which is experiencing the uncorrectable error and that was detected during the full memory scrubbing operation that is being performed while the computing device 200 is in a runtime environment, to the operating system 210. In various examples, upon detecting an uncorrectable error in the current memory location by the memory scrubbing engine 204a, the memory scrubbing engine 204a may notify the BIOS 204 of the uncorrectable error via, for example, an interrupt (e.g., a system management interrupt (SMI)). In response to the interrupt, the BIOS 204 may trigger a persistent memory device root device notification (e.g., an ACPI NVDIMM root device notification) for the operating system 210. The persistent memory device root device notification causes the operating system 210 to retrieve the memory scrub error list 205b. Referring to the ACPI specification example discussed above, upon receiving an ACPI NVDIMM root device notification, the operating system 210 may call a device specific method (DSM) that includes a query ARS status function and that retrieves any new memory locations that are included on a query ARS status output buffer by issuing a query ARS status command.

The method 300 may then proceeds to decision block 318 where a determination is made as to whether the current memory location is the last memory location as discussed above. If it is determined that the current memory location is the last memory location at decision block 318, then the method 300 proceeds to block 326 where the memory scrub error list generated from the full memory scrub operation is provided to the operating system. In an embodiment of block 326, upon completion of the full memory scrubbing operation performed by the memory scrubbing engine 204a, the memory scrubbing engine 204a may notify the BIOS 204 of the completion of the full memory scrubbing operation via, for example, an interrupt (e.g., a system management interrupt (SMI)). The BIOS 204 may then trigger a persistent memory device root device notification (e.g., an ACPI NVDIMM root device notification) for the operating system 210. The persistent memory device root device notification causes the operating system 210 to retrieve the memory scrub error list 205b. Referring to the ACPI specification example discussed above, upon receiving an ACPI NVDIMM root device notification, the operating system 210 may call a device specific method (DSM) that includes the query ARS status function and that retrieves any new memory locations that are included on a query ARS status output buffer by issuing a query ARS status command.

In various embodiments, the memory locations that are provided in the memory scrub error list 205b may be added to the known memory location list 205a after the full memory scrubbing operation has been completed, or while the each memory location that is experiencing an uncorrectable error is being detected by the memory scrubbing engine 204a. As discussed above, any other memory location of the persistent memory device 212 that is experiencing an error, whether or not detected by the full memory scrubbing operation during the runtime environment, may be added to the known memory location list 205a as well. In various embodiments, the BIOS 204 may update the known memory location list 205a by adding and removing memory locations as they have been corrected or deemed uncorrectable. However, in other embodiments, the BIOS 204 may delete the known memory location list 205a after the partial memory scrubbing operation has been performed on the persistent memory, and create a new known memory location list 205a during the runtime environment. In various embodiments, the BIOS 204 will create a new known memory location list 205a whenever there is a change in the configuration of system memory.

In various embodiments of the method 300, the operating system may be unaware of the full memory scrubbing operations due to having being notified that the memory scrubbing operation completed prior to the computing device 200 entering the runtime environment, and the operating system 210 may issue a command to the BIOS 204 to perform a new memory scrubbing operation. If the operating system 210 provides a command to initiate a new memory scrubbing operation while the full memory scrubbing operation is in progress, the BIOS 204 may provide a notification to the operating system 210 that full memory scrubbing operation is in progress. In the ACPI specification example discussed above, the operating system 210 may call the DSM to start an ARS, and the DSM may initiate a start ARS function that outputs a different buffer (e.g., a Start ARS—Output Buffer) than the output buffer that provides the memory scrub error list 205b and that was provided by the DSM's query ARS function (e.g., a Query ARS—Output Buffer). The BIOS 204 may then set a value of a status field in the Start ARS—Output Buffer to indicate that the ARS is in progress while the value in the status field in the Query ARS—Output Buffer is set to complete, which allows the operating system 210 to receive the memory locations experiencing uncorrectable errors when the operating system 210 queries for those memory locations. One of skill in the art in possession of the present disclosure will recognize that, if the value of the status field of the Query ARS—Output Buffer is set to "in progress", then no memory locations experiencing errors would be provided to the operating system 210 in response to the operating system 210 calling the DSM to query the ARS.

In various embodiments of method 300, the operating system 210 may need to know whether the full memory scrubbing operation is completed or not. In order for the operating system 210 to determine whether the full memory scrubbing operation is completed, the operating system 210 may wait to receive a persistent memory device root device notification, which is provided by the BIOS 204 to the operating system 210 when either an uncorrectable error is detected during the full memory scrubbing operation, or the full memory scrubbing operation has completed. When the operating system 210 receives the persistent memory device root device notification, then the operating system 210 may issue a start command to start the full memory scrubbing operation. That start command may either start the full memory scrubbing operation if the full memory scrubbing operation is not in progress, or may cause the BIOS 204 to return a notification that the full memory scrubbing operation is already in progress if the full memory scrubbing operation is running in the background during the runtime environment. If the full memory scrubbing operation can be started, the operating system 210 sets a full memory scrubbing operation completion flag. The operating system 210 can call start the full memory scrubbing operation with a full memory scrubbing operation completion flag bit set. When the flag bit is set, the operating system 210 just wants to read the memory scrub error list 205b, instead of starting new memory scrubbing operation. However, if the operating system 210 really wants to start a new memory scrubbing operation, the operating system 210 can may issue a start command to start the full memory scrubbing operation without the flag bit set.

Thus, systems and methods have been described that provide for memory scrubbing of persistent memory devices. During a booting process for a computing system that includes a persistent memory device, a BIOS may perform a partial memory scrubbing operation on memory locations in the persistent memory device that are known to have errors. After the partial memory scrubbing operations are complete, the BIOS records any of the known memory locations that maintain errors to a memory scrub error list, notifies an operating system that the memory scrub operations have been completed such that the operating system can load and the computing device can enter a runtime environment, and then initiates a full memory scrubbing operation on the persistent memory device. The full memory scrubbing operation runs in the background while the operating system is loaded and the computing device is operating in the runtime environment. The systems and methods of the present disclosure significantly reduce the time it takes the BIOS to complete a booting process such that the computing device may enter the runtime environment relative to conventional systems and conventional methods where the full memory scrubbing operation is completed before the operating system is loaded. Furthermore, in systems that load the operating system such that the computing device may enter the runtime environment before memory scrubbing operations have been completed, the systems and methods prevent data loss that can result from the operating system and system software performing memory operations at memory locations of the persistent memory device that are experiencing uncorrectable errors.

Although illustrative embodiments have been shown and described, a wide range of modification, change and substitution is contemplated in the foregoing disclosure and in some instances, some features of the embodiments may be employed without a corresponding use of other features. Accordingly, it is appropriate that the appended claims be construed broadly and in a manner consistent with the scope of the embodiments disclosed herein.

What is claimed is:

1. A persistent memory error detection system, comprising:
    a chassis;
    a persistent memory device located in the chassis;
    an Operating System (OS) that is located in the chassis and coupled to the persistent memory device; and
    a Basic Input/Output System (BIOS) that is located in the chassis and that is coupled to the persistent memory device and the OS, wherein the BIOS is configured to:
        retrieve, during a boot process and prior to loading the OS, a known memory location list that identifies known memory locations of uncorrectable errors in the persistent memory device;
        determine, during the boot process and while performing a partial memory scrubbing operation on the known memory locations in the persistent memory device that are identified in the known memory location list, whether any of the known memory locations maintain an uncorrectable error;
        add the known memory locations that maintain an uncorrectable error to a memory scrub error list;
        initiate a full memory scrubbing operation on the persistent memory device;
        cause the OS to load and enter a runtime environment while the full memory scrubbing operation is being performed; and
        provide the memory scrub error list to the OS.

2. The system of claim 1, wherein the OS is configured to:
    exclude known memory locations provided in the memory scrub error list from use.

3. The system of claim 1, wherein the BIOS is further configured to:
    detect an uncorrectable error in a first memory location of the persistent memory device during the full memory scrubbing operation that is being performed while the OS is in the runtime environment;
    provide an interrupt to the OS in response to the uncorrectable error in the first memory location of the persistent memory device; and
    add the first memory location to the memory scrub error list to provide an updated memory scrub error list.

4. The system of claim 3, wherein the OS is configured to:
    obtain the updated memory scrub error list in response to receiving the interrupt; and
    exclude the first memory location that the BIOS detected as having an uncorrectable error during the full memory scrubbing operation from use.

5. The system of claim 3, wherein the BIOS is further configured to:
    add the first memory location to the known memory location list that identifies the known memory locations of uncorrectable errors in the persistent memory device.

6. The system of claim 1, wherein the BIOS is further configured to:
    complete the full memory scrubbing operation that is being performed while the OS is in the runtime environment and, in response, provide an interrupt to the OS indicating that the full memory scrubbing operation has completed, wherein the OS is configured to obtain the memory scrub error list in response to receiving the interrupt.

7. The system of claim 1, wherein the BIOS is further configured to:
    receive a command from the OS to begin the full memory scrubbing operation of the persistent memory device while the full memory scrubbing operation that was initiated by the BIOS is being performed; and
    notify the OS that the full memory scrubbing operation of the persistent memory device is already in progress.

8. An Information Handling System (IHS), comprising:
a persistent memory device;
a processing subsystem coupled to the persistent memory device; and
a memory subsystem that is coupled to the processing subsystem and that includes instructions that, when executed by the processing subsystem, causes the processing subsystem to provide a Basic Input/Output System (BIOS) that is configured to:
  retrieve, during a boot process and prior to loading an operating system (OS), a known memory location list that identifies known memory locations of uncorrectable errors in the persistent memory device;
  determine, during the boot process and while performing a partial memory scrubbing operation on the known memory locations in the persistent memory device that are identified in the known memory location list, whether any of the known memory locations maintain an uncorrectable error;
  add the known memory locations that maintain an uncorrectable error to a memory scrub error list;
  initiate a full memory scrubbing operation on the persistent memory device;
  cause the OS to load and enter a runtime environment while the full memory scrubbing operation is being performed; and
  provide the memory scrub error list to the OS.

9. The IHS of claim 8, wherein the memory scrub error list provided to the OS causes the OS to exclude known memory locations provided in the memory scrub error list from use.

10. The IHS of claim 8, wherein the BIOS is further configured to:
  detect an uncorrectable error in a first memory location of the persistent memory device during the full memory scrubbing operation that is being performed while the OS is in the runtime environment;
  provide an interrupt to the OS in response to the uncorrectable error in the first memory location of the persistent memory device; and
  add the first memory location to the memory scrub error list to provide an updated memory scrub error list.

11. The IHS of claim 10, wherein the BIOS is further configured to:
  add the first memory location to the known memory location list that identifies the known memory locations of uncorrectable errors in the persistent memory device.

12. The IHS of claim 8, wherein the BIOS is further configured to:
  complete the full memory scrubbing operation that is being performed while the OS is in the runtime environment and, in response, provide an interrupt to the OS indicating that the full memory scrubbing operation has completed, wherein the OS is configured to obtain the memory scrub error list in response to receiving the interrupt.

13. The IHS of claim 8, wherein the BIOS is further configured to:
  receive a command from the OS to begin the full memory scrubbing operation of the persistent memory device while the full memory scrubbing operation that was initiated by the BIOS is being performed; and
  notify the OS that the full memory scrubbing operation of the persistent memory device is already in progress.

14. A method of memory scrubbing, comprising:
  retrieving, by a basic input/output system (BIOS) during a boot process and prior to loading an operating system (OS), a known memory location list that identifies known memory locations of uncorrectable errors in a persistent memory device;
  determining, by the BIOS during the boot process and while performing a partial memory scrubbing operation on the known memory locations in the persistent memory device that are identified in the known memory location list, whether any of the known memory locations maintain an uncorrectable error;
  adding, by the BIOS, the known memory locations that maintain an uncorrectable error to a memory scrub error list;
  initiating, by the BIOS, a full memory scrubbing operation on the persistent memory device;
  causing, by the BIOS, the OS to load and enter a runtime environment while the full memory scrubbing operation is being performed; and
  providing, by the BIOS, the memory scrub error list to the OS.

15. The method of claim 14, further comprising:
  excluding, by the operating system, known memory locations provided in the memory scrub error list from use.

16. The method of claim 14, further comprising:
  detecting, by the BIOS, an uncorrectable error in a first memory location of the persistent memory device during the full memory scrubbing operation that is being performed while the OS is in the runtime environment;
  providing, by the BIOS, an interrupt to the OS in response to the uncorrectable error in the first memory location of the persistent memory device; and
  adding, by the BIOS, the first memory location to the memory scrub error list to provide an updated memory scrub error list.

17. The method of claim 16, further comprising:
  obtaining, by the OS, the updated memory scrub error list in response to receiving the interrupt; and
  excluding, by the OS, the first memory location that the BIOS detected as having an uncorrectable error during the full memory scrubbing operation from use.

18. The method of claim 16, further comprising:
  adding, by the BIOS, the first memory location to the known memory location list that identifies the known memory locations of uncorrectable errors in the persistent memory device.

19. The method of claim 14, further comprising:
  completing, by the BIOS, the full memory scrubbing operation that is being performed while the OS is in the runtime environment and, in response, providing an interrupt to the OS indicating that the full memory scrubbing operation has completed; and
  obtaining, by the OS, the memory scrub error list in response to receiving the interrupt.

20. The method of claim 14, further comprising:
  receiving, by the BIOS, a command from the OS to begin the full memory scrubbing operation of the persistent memory device while the full memory scrubbing operation that was initiated by the BIOS is being performed; and
  notifying, by the BIOS, the OS that the full memory scrubbing operation of the persistent memory device is already in progress.

* * * * *